(12) United States Patent
Pacha et al.

(10) Patent No.: US 8,188,780 B2
(45) Date of Patent: May 29, 2012

(54) PULSED STATIC FLIP-FLOP

(75) Inventors: Christian Pacha, Munich (DE); Siegmar Köppe, Munich (DE); Karl Zapf, Munich (DE)

(73) Assignee: Infineon Technologies AG, Munich (DE)

( * ) Notice: Subject to any disclaimer, the term of this patent is extended or adjusted under 35 U.S.C. 154(b) by 536 days.

(21) Appl. No.: 11/648,194

(22) Filed: Dec. 29, 2006

(65) Prior Publication Data

US 2007/0182473 A1 Aug. 9, 2007

(30) Foreign Application Priority Data

Dec. 30, 2005 (DE) .................. 10 2005 063 097

(51) Int. Cl.
*H03K 3/00* (2006.01)
(52) U.S. Cl. ........................................ 327/218
(58) Field of Classification Search .................. None
See application file for complete search history.

(56) References Cited

U.S. PATENT DOCUMENTS

| | | | |
|---|---|---|---|
| 4,771,187 A | 9/1988 | Kawamura | |
| 4,803,592 A | 2/1989 | Ashley | |
| 5,557,225 A | 9/1996 | Denham et al. | |
| 6,788,121 B2 | 9/2004 | Nakata et al. | |
| 2004/0095179 A1* | 5/2004 | Eliason | 327/217 |
| 2004/0124899 A1* | 7/2004 | Cavazos et al. | 327/199 |
| 2004/0196082 A1* | 10/2004 | Pacha et al. | 327/215 |
| 2005/0127971 A1* | 6/2005 | Hoff | 327/217 |
| 2005/0189977 A1* | 9/2005 | Chen | 327/218 |
| 2005/0242862 A1* | 11/2005 | Won et al. | 327/218 |
| 2007/0001733 A1* | 1/2007 | Branch et al. | 327/218 |
| 2007/0205818 A1* | 9/2007 | Fiedler | 327/217 |
| 2007/0279115 A1* | 12/2007 | Pacha et al. | 327/218 |

FOREIGN PATENT DOCUMENTS

| | | |
|---|---|---|
| CN | 1175327 A | 3/1998 |
| EP | 0203491 B1 | 12/1986 |

(Continued)

OTHER PUBLICATIONS

Tschanz, James et al. "Comparative Delay and Energy of Single Edge-Triggered & Dual Edge-Triggered Pulsed Flip-Flops for High-Performance Microprocessors," in *Proc. Int. Symposium Low Power Electronics and Design*. Aug. 2001. pp. 147-152. (6 Pages).

(Continued)

*Primary Examiner* — Lincoln Donovan
*Assistant Examiner* — Khareem E Almo
(74) *Attorney, Agent, or Firm* — Maginot, Moore & Beck

(57) ABSTRACT

A pulsed static flip-flop comprises a first logic device which combines a logic signal with a pulsed signal and outputs a set signal, a second logic device which logically combines the logic signal with a complementary pulsed signal and outputs a reset signal; and a latch device comprising storage means which hold a logic hold level to be tapped off as a stored logic state of the logic signal. The logic hold level is adjustable to a first logic level by a first push-pull transistor controlled by the set signal and to a second logic level by a second push-pull transistor controlled by the reset signal.

16 Claims, 13 Drawing Sheets

FOREIGN PATENT DOCUMENTS

| | | |
|---|---|---|
| EP | 0250932 B1 | 2/1989 |
| EP | 0250 932 B1 | 4/1992 |
| EP | 0203 491 B1 | 11/1992 |
| JP | 1276915 | 11/1989 |
| JP | 02192216 | 7/1990 |
| JP | 7095013 A | 4/1995 |
| JP | 8237238 A | 9/1996 |
| JP | 09321614 | 12/1997 |

OTHER PUBLICATIONS

Tschanz, J. et al., Comparative Delay and Energy of Single Edge-Triggered & Dual Edge-Triggered Pulsed Flip Flops for High-Performance Microprocessors. Proceedings of the 2001 International Symposium on Low-Power Electronics and Design, S. 147-152.

* cited by examiner

PULSED STATIC FLIP-FLOP

BACKGROUND OF THE INVENTION

The present invention relates to a pulsed static flip-flop for storing a logic state of a logic signal.

Flip-flops are used to rapidly store logic states, for example in pipeline stages of microprocessors. In this case, critical variables are the set-up time which indicates the temporal interval at which the logic level to be stored is changed with respect to a clock signal which defines the transparency of the flip-flop. Another important variable is the delay time $t_{CLK-Q}$ which denotes the temporal interval between a clock signal edge, which determines the transparency of the flip-flop, and the presence of the stored logic state at the output of the flip-flop. The hold time of a flip-flop is the minimum requisite time for which an input data item must remain at its signal level, after a clock edge which initiates the transparency, so that the data item is reliably stored in the flip-flop.

FIG. 1 illustrates a conventional clock-edge-controlled flip-flop MSFF comprising a master latch and a slave latch. The flip-flop MSFF comprises a data input DI, a clock input CLKI, and a data output QO. Provision is made of two latches LT1 and LT2 which each comprise a data input D11, D22, a data output Q11, Q22 and a clock input C1, C2. An input data item D is supplied to the data input D11 of the first latch LT1 and the output data item QI from the first latch LT1 is supplied to the data input D22 of the second latch LT2. The output data item Q can be tapped off from the output Q22 of the second latch LT2. A clock signal CLK is supplied to the clock input CLKI, said signal being inverted and delayed, via a first inverter I1, to form the delayed and inverted clock signal CLK'. The inverse clock signal CLK' is supplied to the clock input C1 of the first latch LT1. The delayed clock signal CLK' is also inverted by a second inverter 12 and, delayed further, is supplied, as a further clock signal CLK", to the clock input C2 of the second latch LT2. Upon a rising clock edge of the clock signal CLK, the second latch LT2 is switched to be transparent and the first latch LT1 or the master latch is locked. As a result, the data item D is read into the master/slave flip-flop MSFF upon a rising clock edge and this state is output at the output QO over one clock period.

Such flip-flops are used, in particular, in pipeline stages of microprocessors. In this case, data are fed to the inputs of the flip-flops and further logic circuits are coupled to the output of a respective flip-flop. The respective logic operation of the logic circuit then provides a further input data item to a flip-flop which is coupled downstream. Chains of flip-flops and logic circuits are thus generally formed. Since the logic circuits have capacitances, they must be driven by the respective flip-flop. A requisite signal propagation time is also composed of the sum of $t_{CLK-Q}$, $t_{LOGIC}$ and $t_{SETUP}$, $t_{CLK-Q}$ being the delay time between a respective clock edge of the clock signal and an associated edge of the output data item, $t_{LOGIC}$ being the delay caused by the respective logic circuit, and $t_{SETUP}$ being the set-up time. The processing times and provision times are critical in microprocessors, in particular.

BRIEF SUMMARY OF THE INVENTION

In one aspect of the invention, a pulsed static flip-flop comprises
a first logic device which logically combines the logic signal with a pulsed signal and outputs a set signal;
a second logic device which logically combines the logic input signal with a complementary pulsed signal and outputs a reset signal; and
a latch device comprising a storage means which holds a logic hold level, the hold level being able to be set to a first logic level by a first push-pull transistor which is controlled by the set signal, and the hold level being able to be set to a second logic level by a second push-pull transistor which is controlled by the reset signal. In this case, the hold level can be tapped off as a stored logic state of the logic signal.

In one aspect of the inventive flip-flop, the two push-pull transistors realize a rapid signal transition from a first logic level to a second logic level, for example from a low level to a high level, while a transition from a high level to a low level is effected using the second push-pull transistor. This may have the advantage that the push-pull transistors can be dimensioned such that they match and therefore realize particularly rapid level transitions in the case of a changing input signal, that is to say the logic signal.

BRIEF DESCRIPTION OF THE SEVERAL VIEWS OF THE DRAWINGS

The invention will be described in greater detail hereafter, by way of non-limiting examples, with reference to the embodiments shown in the drawings.

DETAILED DESCRIPTION OF THE INVENTION

Figure 1:
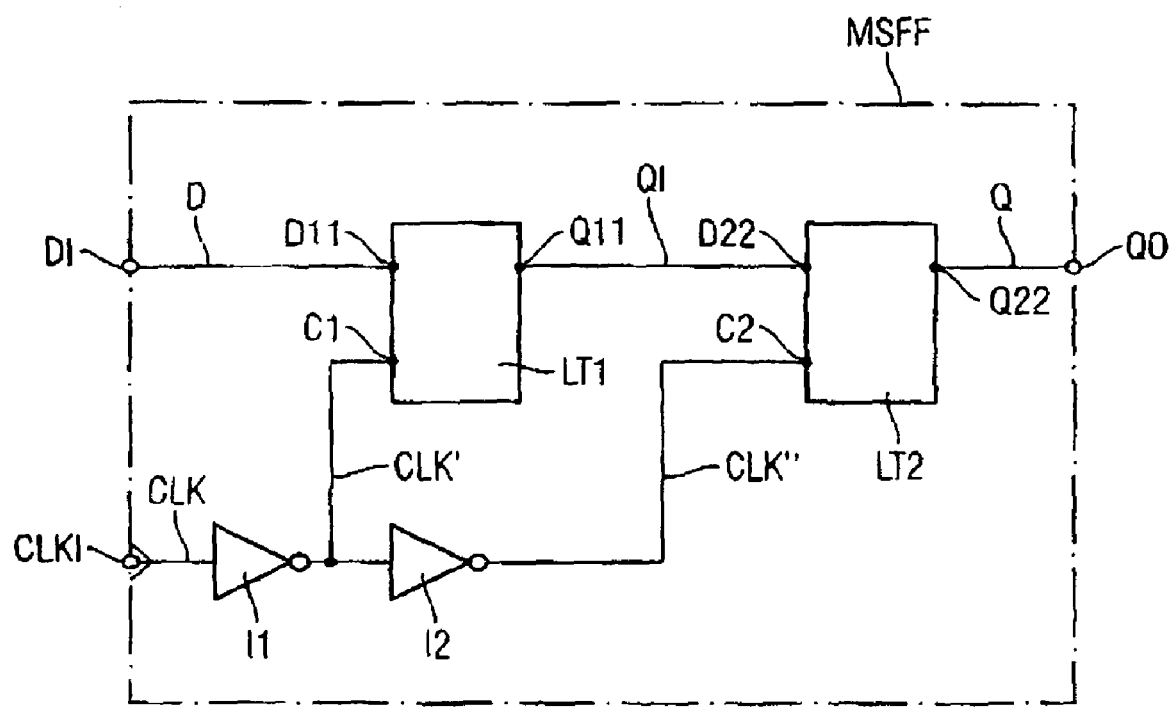
FIG. 1, as discussed above, is a conventional master/slave flip-flop.

Following, preferred embodiments of the invention are described with reference to the appended figures. Unless specified otherwise, identical or functionally identical elements are denoted with the same reference signs. Additionally, the embodiments described are showing only some of the several possible embodiments of the invention. Embodiments of the invention my include one or several of the following aspects.

In one embodiment of the inventive flip-flop, the first push-pull transistor may be a push-pull transistor which is complementary to the second push-pull transistor.

The latch device may comprise an inverter comprising an input and an output, a holding transistor and a complementary holding transistor each comprising a controllable path and a control connection. In this embodiment, the input of the inverter may be connected to a potential node between the controllable paths of the holding transistors, which are connected in series between a first supply potential connection and a second supply potential connection. The output of the inverter may be connected to the control connections of the holding transistors, the input of the inverter being able to be switched, via the push-pull transistor, on the basis of the reset signal at the second supply potential connection. The input of the inverter can also be switched, via the complementary push-pull transistor, on the basis of the set signal at the first supply potential connection. The stored logic state of the logic signal can then be tapped off from the input of the inverter.

In comparison with conventional latch devices, the respective level transitions are driven separately in the inventive circuit arrangement. This makes it possible to achieve a particularly high speed of the flip-flop.

In one embodiment of the inventive flip-flop, the push-pull transistors each comprise a controllable path and a control connection, the controllable paths being connected in series between the first supply potential connection and the second supply potential connection. The reset signal is then fed to the control connection of the complementary push-pull transistor, and the set signal is fed to the control connection of the push-pull transistor. In this case, the input of the inverter is connected to a further potential node between the controllable paths of the push-pull transistors.

A further transistor comprising a controllable path and a control connection may be provided, wherein the controllable path is connected between the potential node and the controllable path of the holding transistor. The set signal is fed to the control connection of the further transistor.

This embodiment may have the advantage that the complementary push-pull transistor, which may be in the form of a PMOS transistor enables the potential node when a high level is applied to the control connection, and the potential node is reliably pulled to the level of the first supply voltage potential in the case of a low level at the control connection of the complementary push-pull transistor. As a result of the further transistor, the size of the complementary push-pull transistor can be configured to be smaller. Since the complementary push-pull transistor or PMOS transistors is/are generally weaker than the NMOS transistors designed using the same technology, the further transistor may provide additional reliability of the flip-flop.

In a further embodiment of the inventive flip-flop, a further complementary transistor comprising a controllable path and a control connection is provided, wherein the controllable path is connected between the controllable path of the complementary holding transistor and the potential node. In this embodiment, the reset signal is fed to the control connection of the further complementary transistor. The further complementary transistor may ensure, for example when the reset signal is at a low level, that the push-pull transistor cannot pull the potential node to the second supply voltage potential. This feedback of the respective holding loop, which can be interrupted, realizes a reliable circuit in the latch device of the invention on the basis of the set and reset signals.

The first logic device may be in the form of a NAND gate. In the design in the form of a NAND gate, or in the form of a logic Not-AND gate, provision may preferably be made of a first logic transistor and a second logic transistor and a first complementary logic transistor and a second complementary logic transistor each comprising a controllable path and a control connection. In this embodiment of the inventive flip-flop, the controllable paths of the first complementary logic transistor and the controllable paths of the first and second logic transistors are connected in series between a first supply potential connection and a second supply potential connection. The controllable path of the second complementary logic transistor may be connected between the first supply potential connection and a set signal node, the set signal node being present between the controllable path of the first complementary logic transistor and the controllable path of the first logic transistor. In this embodiment, the pulsed signal may be fed to the control connections of the first logic transistor and of the second complementary logic transistor. The logic signal may be fed to the control connections of the first complementary logic transistor and of the second logic transistor. In this case, the set signal can be tapped off from the set signal node.

In another embodiment of the inventive flip-flop, the two logic transistors and the complementary holding transistor, in particular, control the stored logic state of the latch device in the event of a transition of the logic signal, for example of the input signal for the flip-flop, from a logic high level to a logic low level.

The second logic device may preferably be in the form of a NOR gate. In this design in the form of a NOR gate, or in the form of a Not-OR gate, the second logic device may preferably comprise a first logic transistor and a second logic transistor and a first complementary logic transistor and a second complementary logic transistor each having a controllable path and a control connection. In this case, the controllable paths of the first and second complementary logic transistors and the controllable path of the first logic transistor may be connected in series between a first supply potential connection and a second supply potential connection. The controllable path of the second logic transistor may be connected between a reset signal node, which lies between the controllable path of the second complementary logic transistor and the controllable path of the first logic transistor, and the second supply-potential connection. The logic signal may be fed to the control connections of the first complementary logic transistor and of the first logic transistor. The complementary pulsed signal may be fed to the control connections of the second complementary logic transistor and of the second logic transistor. In this embodiment, the reset signal can then be tapped off from the reset signal node. With this design of the second logic device in the form of a NOR gate, the two complementary logic transistors and the holding transistor essentially control the state of the latch device in the event of a change in the logic state of the logic signal from low to high.

The flip-flop may be designed to have an asynchronous reset function. A reset transistor and a complementary reset transistor each comprising a controllable path and a control connection may then preferably be provided, the controllable path of the reset transistor being connected between the controllable path of the holding transistor and the second supply potential connection. The controllable path of the complementary reset transistor may then be connected between the first supply potential connection and the input of the inverter. In this case, an asynchronous reset signal may be fed to the control connections of the reset transistors.

The flip-flop may also be designed to have an asynchronous set function. A set transistor and a complementary set transistor each comprising a controllable path and a control connection may then be provided, the controllable path of the set transistor being connected between the input of the inverter and the second supply potential connection. The controllable path of the complementary set transistor may be connected between the first supply potential connection and the controllable path of the complementary holding transistor. An asynchronous set signal may be fed to the control connections of the set transistors.

Irrespective of the state of the clock signal, the set or reset function makes it possible to use the latch device to set the stored logic level.

A further embodiment of the inventive flip-flop provides a scanning input stage which switches a test signal, as a logic signal, or the logic signal to the first and second logic circuits on the basis of a test control signal. Since, when used in critical paths of microprocessors, many chains of flip-flops and logic circuits are designed to be parallel and the method of operation of all of these flip-flops should be able to be tested, the output or the hold level is used as a logic input signal for a similar flip-flop, which is provided in a parallel branch, by means of the scanning input stage in a test mode of the corresponding microprocessor. A shift register which allows a sequence of test signals to be switched through in a clocked manner is thus designed. In this test mode, the method of operation of all of the flip-flops which are provided in the respective shift register can then be checked.

Another embodiment of the inventive flip-flop provides a scanning output stage. The latter may be coupled to the latch device and switches a test output signal, which is derived from the stored logic state of the logic signal, to a test output or switches the test output to a prescribed logic level on the basis of a test control signal. This output stage of the inventive flip-flop makes it possible to reduce the power consumption by virtue of the intended scanning function of the flip-flop.

In this case, the scanning output stage may preferably comprise at least one transmission gate.

Another embodiment of the inventive flip-flop provides a pulse generator which generates the pulsed signal and the complementary pulsed signal on the basis of a clock signal. In this case, the pulsed signal generator may preferably generate the pulsed signal and the complementary pulsed signal upon each rising and/or falling clock edge of the clock signal. In this case, one embodiment may provide at least one logic gate, in particular a NAND gate, for the pulse generator. In another embodiment of the inventive flip-flop, the pulse generator also comprises at least one delay path. In a further embodiment of the inventive flip-flop, the delay time of this delay path can be programmed. In particular, a so-called double-edge-triggered flip-flop can advantageously be designed when a pulse for controlling the transparency phase of the inventive flip-flop is generated upon each clock signal edge.

Adapting the delay time may make it possible to flexibly adapt the transparency phase of the inventive flip-flop when, for example in clock distribution trees, the times of the arriving clock edges are different when a large number of flip-flops are used.

The respective transistors may be in the form of NMOS transistors and the respective complementary transistors may be in the form of PMOS transistors. The transistors may be designed using CMOS technology.

In order to speed up the performance of conventional flip-flops, pulsed flip-flop can be used.

Figure 2:
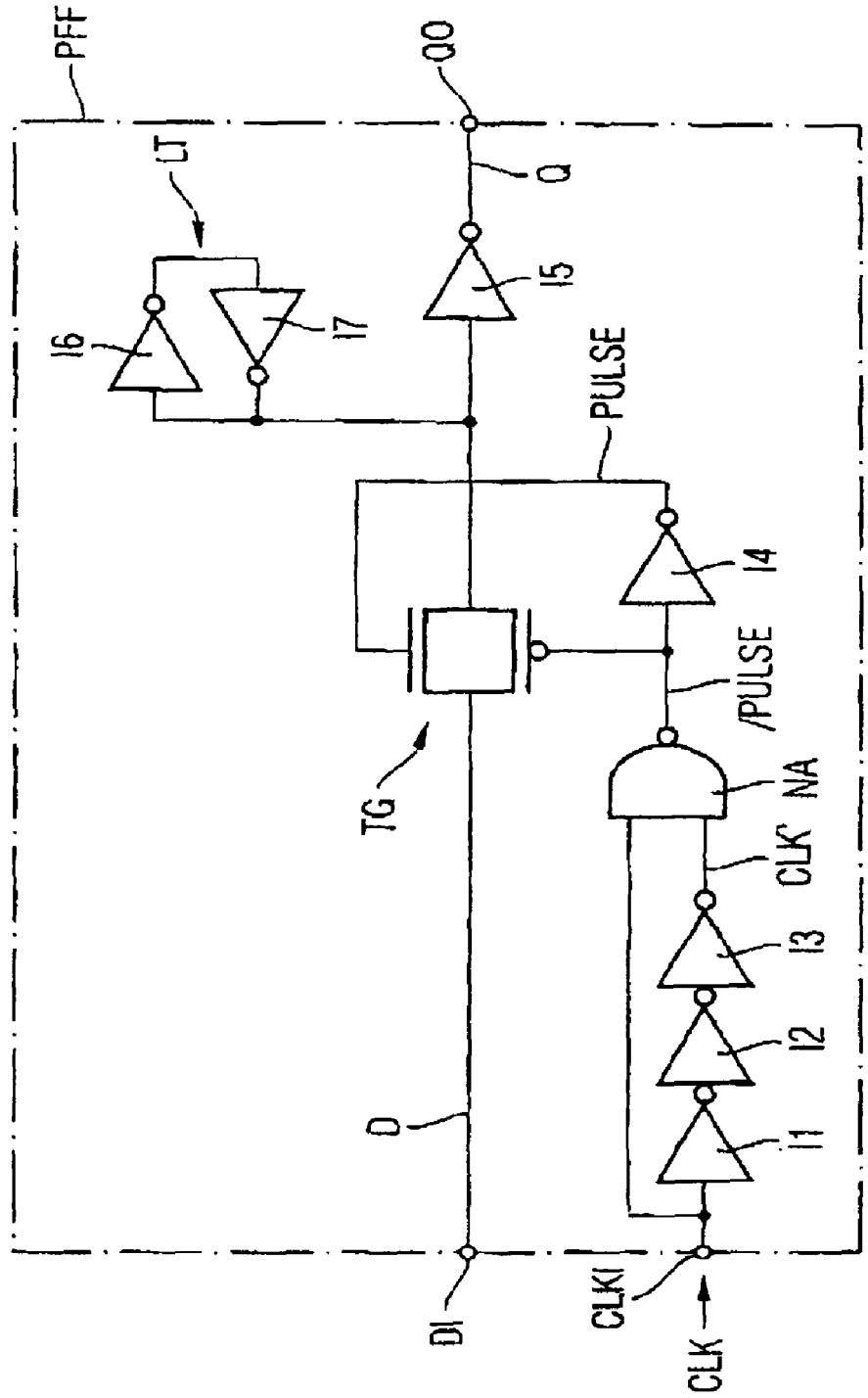
FIG. 2 is a conventional pulsed flip-flop.

FIG. 2 shows a corresponding circuit arrangement for a pulsed flip-flop PFF. In the case of pulse-triggered flip-flops, provision is made of input stages which use the external clock signal CLK to generate an internal pulsed signal which drives a latch as an output stage. The input data item D is fed to a latch LT, which is illustrated here in the form of two feedback inverters I6, I7, via a data input DI and a transmission gate TG. The data item which is buffer-stored in this manner is output to an output QO in the form of an inverse output data item /Q via a further inverter I5. The transmission gate TG is driven using control signals PULSE, /PULSE which are complementary to one another and each have a pulse shape. The clock signal CLK is supplied to a clock signal input CLKI and is injected into a NAND gate NA. In a delay path comprising three inverters I1, I2, I3, the clock signal is delayed and is likewise supplied to the NAND gate in the form of a delayed clock signal CLK'. The pulsed signal PULSE which is generated in this manner and can be tapped off from the output of the NAND gate NA, or a complementary pulsed signal /PULSE which is generated by an inverter I4, therefore controls the transparency phase between the input DI and the output QO. The transparency windows are at 125 ps, for example, when the transistors used are designed using 180 nm CMOS technology.

Figure 3:
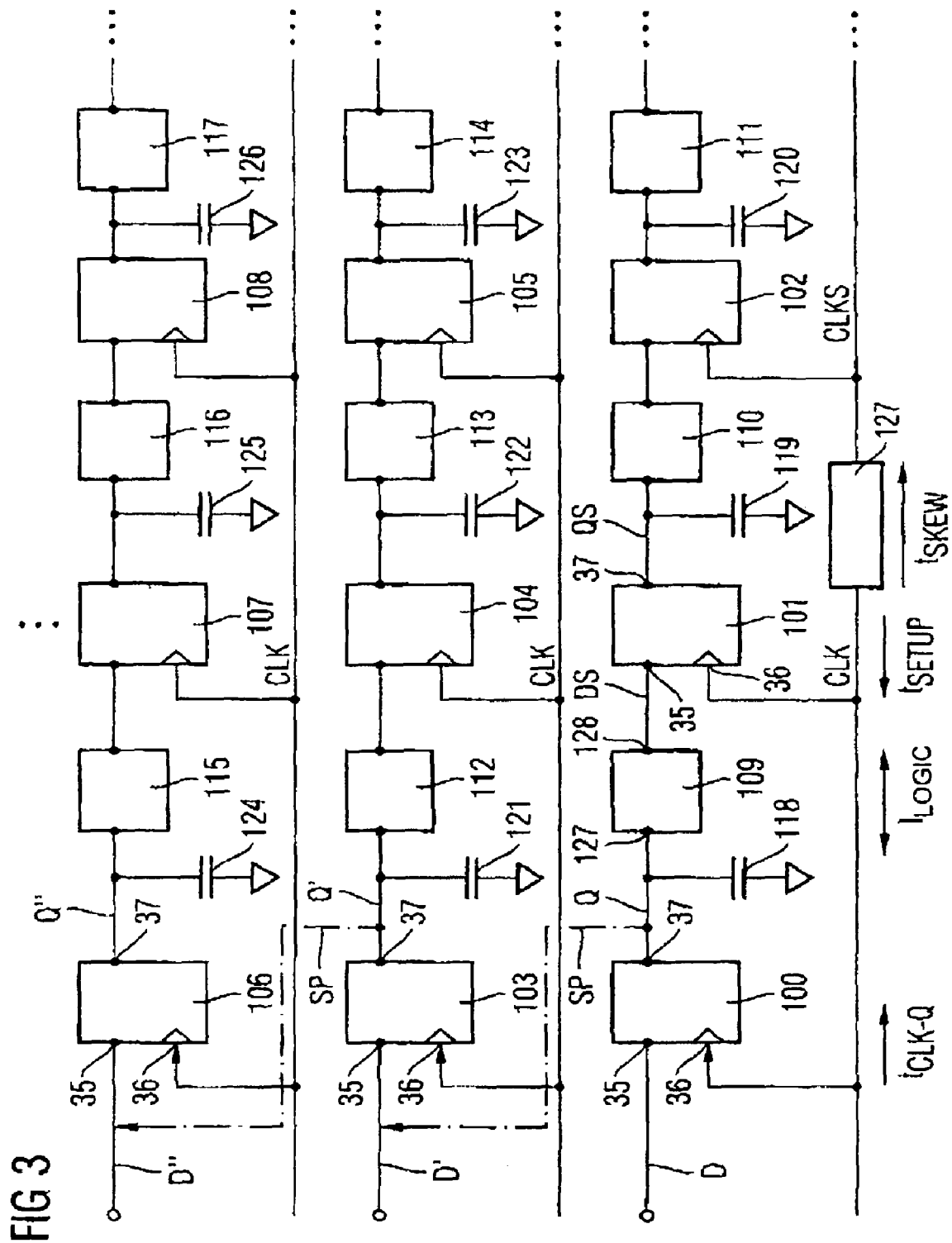
FIG. 3 illustrates diagrammatically the use of flip-flops in a pipeline stage of a microprocessor.

FIG. 3 illustrates a typical use of flip-flops, particularly according to one or more embodiments of the present invention, for example in a microprocessor system. For example, flip-flops 100-108, which are embodiments of one or more aspects of the invention and each comprising a data input 35, a clock input 36 and a data output 37 are illustrated. A data signal D having a logic high or low level, for example, is supplied to the data input 35 of the first flip-flop 100. The corresponding output signal Q of the flip-flop 100 is supplied to a logic circuit 109 having an input 127 and an output 128. The corresponding data signal DS is then supplied to the data input 35 of the second flip-flop 101 which is likewise clocked by the clock signal CLK and provides an output signal QS at the output 37.

In this case, FIG. 3 illustrates three exemplary branches having flip-flops 100-108 and logic circuits 109-117 which are connected in series. In this case, a data signal D' is supplied to the second branch and a data signal D" is supplied to the third branch. The logic circuits 109-117 represent, for the outputs 37 of the flip-flops 100-108, loads which are to be driven. In particular, the logic circuits 109-117 have capacitances which are illustrated, for example, in the form of capacitors 118-126 in FIG. 3.

During signal processing, signal delays occur as a result of the properties of the flip-flops 100-108 and as a result of the signal processing in the logic circuits 109-117 and in the branch trees for the clock signal.

In this case, the flip-flop delay time is $t_{CLK-Q}$ which denotes the signal propagation time or delay between a clock edge, which initiates the transparency phase of the flip-flop, and the presence of the level, which corresponds to the data input signal, at the output 37 of the flip-flop 100. It is assumed in the following non-limiting examples that a respective rising clock signal edge marks the starting point of a respective transparency phase of the flip-flop.

The processing time $t_{LOGIC}$ of the respective logic circuit 109 also influences the signal propagation times. The set-up time $t_{SETUP}$ of the flip-flops used also plays a role. As already mentioned by way of introduction, the set-up time $t_{SETUP}$ indicates the time for which a data input signal is applied, with respect to the rising clock edge of the clock signal, so that the flip-flop can detect the input signal level and reliably provides it at the output.

Another time which characterizes a flip-flop is the hold time $t_{HOLD}$ which indicates the length of time for which a data input signal must remain at the logic level present upon a rising clock edge so that said level is correctly detected and stored in the flip-flop.

The characteristic times $t_{CLK-Q}$, $t_{SETUP}$ and $t_{HOLD}$ may have different values for input signal levels which change from 0 to 1 or low to high and from 1 to 0 or high to low.

Furthermore, offsets between the rising clock signal edges may result in different flip-flops on account of delays in the clock signal paths. This is illustrated in FIG. 3 by means of the functional block 127 which causes a time offset $t_{SKEW}$. The resulting clock signal CLKS is delayed by the delay time $t_{SKEW}$ in comparison with the clock signal CLK.

The greatest signal delay is generally caused by the respective logic circuit 109-117 having logic depths of 20 to 25. In this case, capacitances 118-126 of between 40 fF and 80 fF are typical values.

If individual logic circuits 109-117 have particularly short signal propagation times, the hold times may be violated since the data signal DS which is supplied to a downstream flip-flop executes a level change too early with respect to the set-up or hold time required. In order to handle different delays caused by the logic circuits 109, 110, 111 in a signal branch, it is advantageous to configure the transparency phase of the flip-flops to be variable. This is effected, according to one embodiment of the invention, by changing the signal pulses which are derived from the clock signal edge, which will be explained in more detail below.

In a possible test operating mode of a circuit arrangement having flip-flops, the output signals Q from the flip-flop 100 in the first branch are supplied, in the so-called scanning mode, to the flip-flop 103 in the second branch as an input signal D' and the output signal Q' from the flip-flop 103 in the second branch is used as an input signal D" for the flip-flop 106 in the third branch. A shift register comprising the flip-flops 100, 103, 106 is thus formed in the test operating mode or scanning mode. A sequence of test signals which can be read at the output 37 of the last flip-flop in the shift register chain is then injected into the input 35 of the first flip-flop 100. The corresponding signal path is illustrated in the form of a dash-dotted line SP. This scanning mode can be used to detect errors in the flip-flops.

Figure 4:
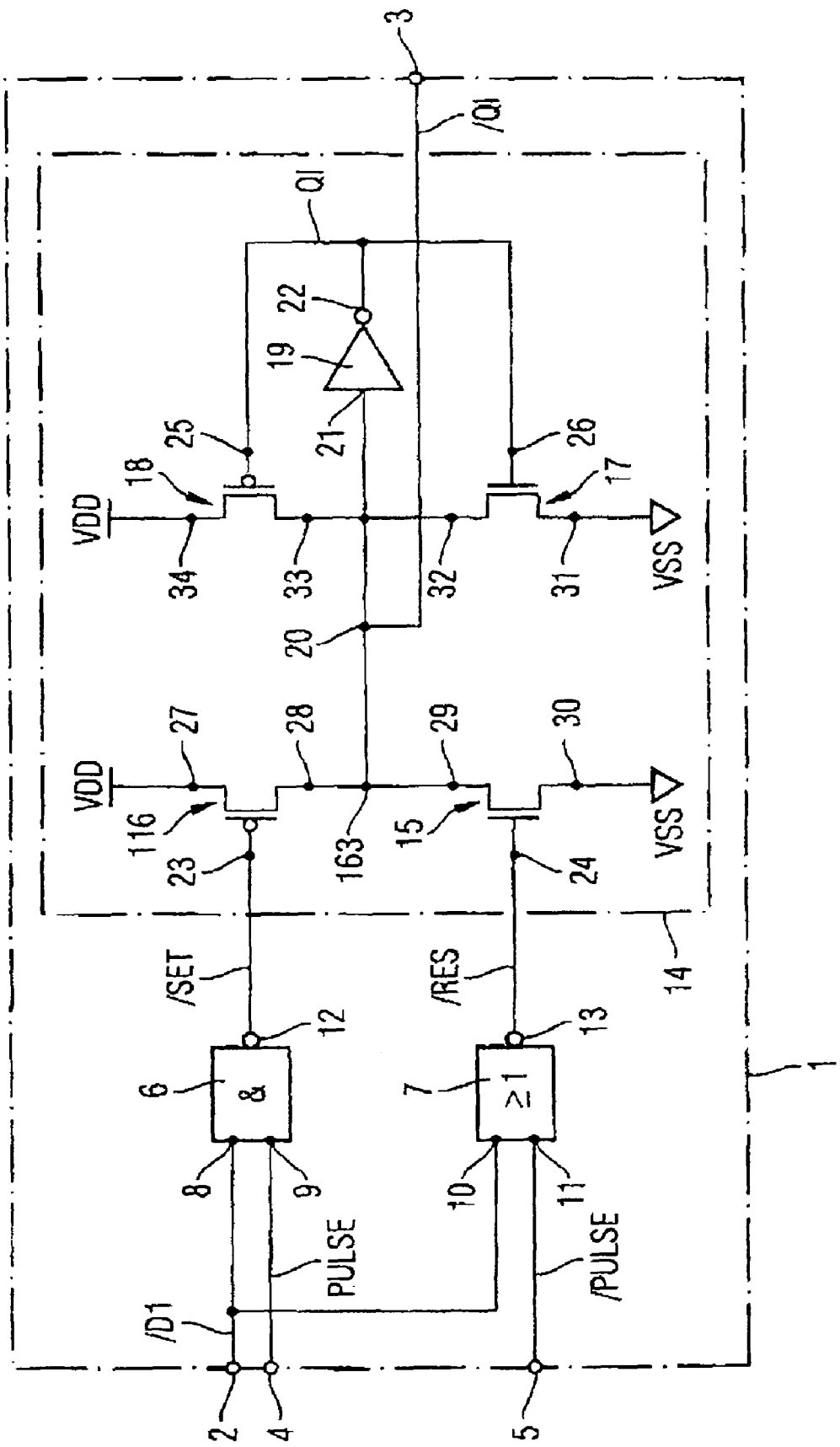
FIG. 4 is a basic circuit diagram of a pulsed static flip-flop.

FIG. 4 diagrammatically shows a basic form of one possible embodiment of the inventive pulsed static flip-flop 1.

The flip-flop 1 has an input 2 for a logic signal which is denoted /D1 in this exemplary embodiment, and an output 3 for an output signal which is denoted /QI in this example. Provision is also made of a pulsed signal input 4, 5 for injecting a pulsed signal PULSE and a complementary pulsed signal /PULSE.

A NAND gate 6 having two inputs 8, 9 and an output 12 is provided. The logic signal /D1 and the pulsed signal PULSE are supplied to the inputs. The NAND gate 6 provides a set signal /SET at the output 12. The logic signal /D1 and the complementary pulsed signal /PULSE are supplied to the inputs 10, 11 of a NOR gate 7. A reset signal /RES can be tapped off from an output 13 of the NOR gate. The set and reset signals /SET, /RES are used to drive a latch device 14.

The latch device 14 has an NMOS push-pull transistor 15 and a PMOS push-pull transistor 16 each having a control connection or gate connection 24, 23 and a respective controllable path or source-drain path. A potential node 20 to which an input 21 of an inverter 19 is connected is provided between the drain connection 28 of the PMOS push-pull transistor 16 and the drain connection 29 of the NMOS push-pull transistor 15. An internal data signal or a logic state QI can be tapped off from an output 22 of the inverter 19. An NMOS holding transistor 17 and a PMOS holding transistor 18 are provided. The source connection 27 of the PMOS push-pull transistor 16 is connected to a first supply potential connection VDD and the source connection 30 of the NMOS push-pull transistor 15 is connected to a second supply potential connection VSS.

The holding transistors 17, 18 each have a controllable path, or a drain connection and a source connection 31, 32, 33, 34, and a control connection or gate connection 26, 25. The controllable paths are connected in series between the first supply potential VDD and the second supply potential VSS. For the purpose of further explanation, the terms "supply potential connection" and "supply potential" VDD or VSS are used synonymously. The drain connection 33 and the drain connection 32 of the PMOS holding transistor and of the NMOS holding transistor, respectively, are connected to the potential node 20. The signal level QI which can be tapped off from the output 22 of the inverter 19 is fed to the gate connection 25 of the PMOS holding transistor and to the gate connection 26 of the NMOS holding transistor 17.

For example, the pulsed signal PULSE provides a signal pulse having a prescribed pulse length upon a rising clock signal edge (not illustrated here). The complementary pulsed signal /PULSE is complementary to the pulsed signal PULSE, that is to say is inverted. If the logic signal /D1 is at a logic low level, for example, during the signal pulse of the pulsed signal, the set signal /SET provides a logic high level. The PMOS push-pull transistor 16 thus turns off. At the same time, the reset signal /RES is at a logic high level for the duration of the pulse width of the complementary pulsed signal /PULSE and thus turns on the controllable path of the NMOS push-pull transistor 15. The potential node 20 is thus pulled to the second supply potential level VSS. This corresponds to a logic low level, for example. A logic high level is thus present, as the logic level of the signal QI, at the output 22 of the inverter 19. In one embodiment of the inventive flip-flop which is not explained in any more detail here, signal pulses are generated both upon rising and falling clock signal edges, and a double-edge-triggered flip-flop having the inventive properties is provided in this manner.

The latch device 14 stores the level of the signal /D1, which can be tapped off as a hold level /QI from the potential node 20, using the loop between the inverter output 22, the gate connection 26 and thus the holding transistor 17, which has been turned on, via the potential node 20 to the inverter input 21.

Figure 5:
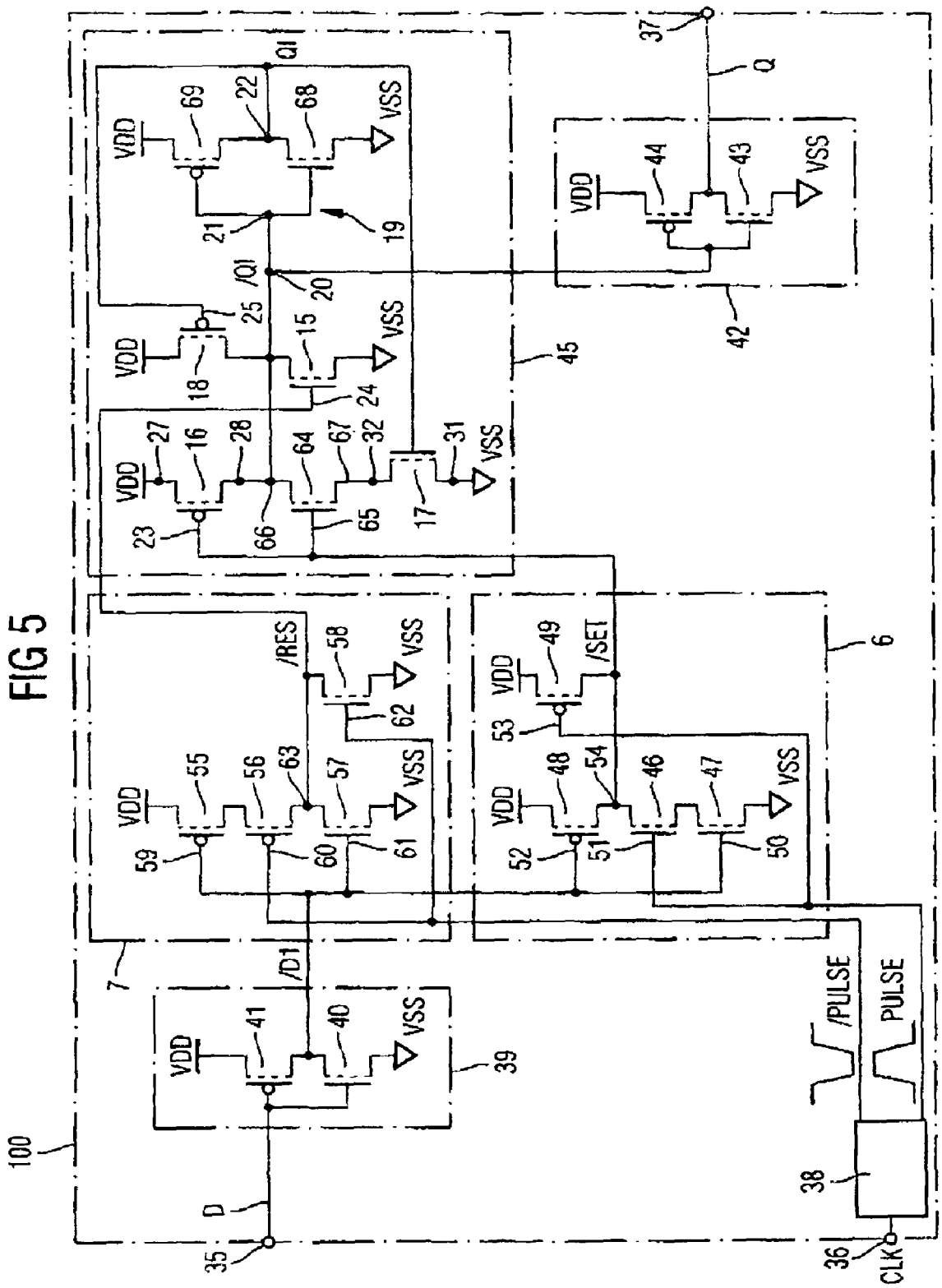
FIG. 5 is a first exemplary embodiment of a static flip-flop.

FIG. 5 illustrates a further exemplary embodiment of the inventive pulsed static flip-flop.

The flip-flop 100 has a data input 35, a clock input 36 and a data output 37 for a logic data input signal D, a clock signal CLK and a logic data output signal Q, respectively. The flip-flop has a pulse generator 38 which generates a pulsed signal PULSE and a complementary pulsed signal /PULSE on the basis of the clock signal edges.

Provision is made of an input driver 39 which is in the form of an inverter, is connected downstream of the data input 35 and has an NMOS transistor 40 and a PMOS transistor 41 which are connected as inverters. The input driver provides an internal data signal /D1 which is inverse to the data input signal D.

An output driver 42 is connected downstream of the latch device 45 and likewise has an NMOS transistor 43 and a PMOS transistor 44 which are connected as inverters. The output driver 42 provides the data output signal Q which is supplied to the data output 37. The output driver 42 receives, from the latch device 45, the logic state /QI stored by the latch device.

The first logic device 6 which is in the form of a NAND gate has two NMOS transistors 46, 47 and two PMOS transistors 48, 49 each having a gate connection 50, 51, 52, 53 and a load path or source-drain path. The source-drain paths of the first PMOS transistor 48 and of the NMOS transistors 46, 47 are connected in series between a first supply potential connection VDD and a second supply potential connection VSS.

In this case, the internal data signal /D1 is supplied to the gate connection 52 of the first PMOS transistor 48 and to the gate connection 50 of the second NMOS transistor 47. The controllable path of the second PMOS transistor 49 is connected between the first supply potential connection VDD and a potential node 54, the potential node 54 lying between the controllable paths 48, 46 of the first PMOS transistor 48 and of the first NMOS transistor 46. The pulsed signal is supplied to the gate connections 51, 53 of the first NMOS transistor 46 and of the second PMOS transistor 49. The set signal /SET can be tapped off from the node 54.

The second logic device 7 which is in the form of a NOR gate has a first PMOS transistor 55 and a second PMOS transistor 56 and a first NMOS transistor 57 and a second NMOS transistor 58 each having a controllable path and a gate connection 59, 60, 61, 62. The controllable paths of the PMOS transistors 55, 56 and of the first NMOS transistor 57 are connected in series between the first supply potential VDD and the second supply potential VSS. The internal data signal /D1 is supplied to the gate connections 59 and 61 of the first PMOS transistor 55 and of the first NMOS transistor 57. The controllable path of the second NMOS transistor 58 is connected between a potential node 63 and the second supply potential VSS, the potential node 63 lying between the controllable paths of the second PMOS transistor 56 and of the first NMOS transistor 57. The complementary pulsed signal /PULSE is fed to the gate connections 60, 62 of the second PMOS transistor 56 and of the second NMOS transistor 58. The reset signal /RES can be tapped off from the potential node 63.

The latch device 45 is essentially constructed as illustrated in FIG. 4, the inverter 19 being constructed from an NMOS transistor 68 and a PMOS transistor 69. Furthermore, a further NMOS transistor 64 having a control connection or gate connection 65 and a controllable path, for example a path between a source connection 67 and a drain connection 66, is additionally provided. The drain connection 66 of the additional NMOS transistor 64 is connected to the drain connection 28 of the PMOS push-pull transistor 16 and the source connection 67 of the additional NMOS transistor 64 is connected to the drain connection 32 of the NMOS holding transistor 17. The set signal /SET is supplied to the gate connection 65 of the additional NMOS transistor 64. The NMOS transistor 64 ensures that, when the set signal /SET is at a logic low level, the PMOS push-pull transistor 16 reliably pulls the potential node 20 to the first supply potential VDD, that is to say to a logic high level.

The inventive flip-flop 100 is particularly highly suitable for use in a standard cell library since effective decoupling from the input 35 or from the output 37 is effected using the input and output drivers 39, 42.

One particular advantage of the exemplary inventive flip-flop 100 is also that at most two transistors or load paths are connected in series in a critical transistor path. These are the transistors 40, 55, 56, 15 and 44 in the event of a signal change of the data input signal D from a logic low level to a logic high level. In the event of a level change of the data input signal D from a logic high level to a logic low level, the critical transistor paths are given by the transistors 41, 46, 47, 16 and 43. Since there are only two respective controllable paths between the signal output 37 and a supply potential connection VSS, VDD, the inventive flip-flop is highly suitable for an implementation using low-consumption CMOS technology, in particular having structures smaller than 100 nm.

In comparison with flip-flops having master/slave latches, it is possible to achieve a shorter delay time. According to one aspect of the invention, a rising clock edge of the clock signal CLK is split into two inverse pulses PULSE, /PULSE by the pulse generator 38. The pulsed signal PULSE and the complementary pulsed signal /PULSE are logically combined, in the logic devices 6, 7, with the data signal D, /D1, which has been driven or inverted by the input driver 39, in order to generate the set and reset signals /SET, /RES. The push-pull transistors 15, 16 may be in the form of powerful drivers. When the logic level stored in the latch device 45 changes at the potential node 20, the push-pull transistors 15, 16 are used, on the one hand, to rapidly overwrite the stored level by switching the potential node 20 to the first supply potential VDD using the PMOS push-pull transistor 16 or to the second supply potential VSS using the NMOS push-pull transistor 15.

The output driver 42 may usually drive capacitances of 40 fF to 80 fF, as is diagrammatically illustrated in FIG. 3 by means of the capacitors 118-126. Specific dimensioning of the respective transistors which are relevant to speed (the transistors 40, 55, 56, 15, 44 in the event of an input level change from low to high and the transistors 41, 46, 47, 16 and 43 in the event of an input level change from high to low) makes it possible to easily achieve a particularly advantageous ratio between internal loads and the requisite transistor driver strength. This may make it possible to produce particularly rapid signal transitions in the inventive flip-flop.

Figure 6:
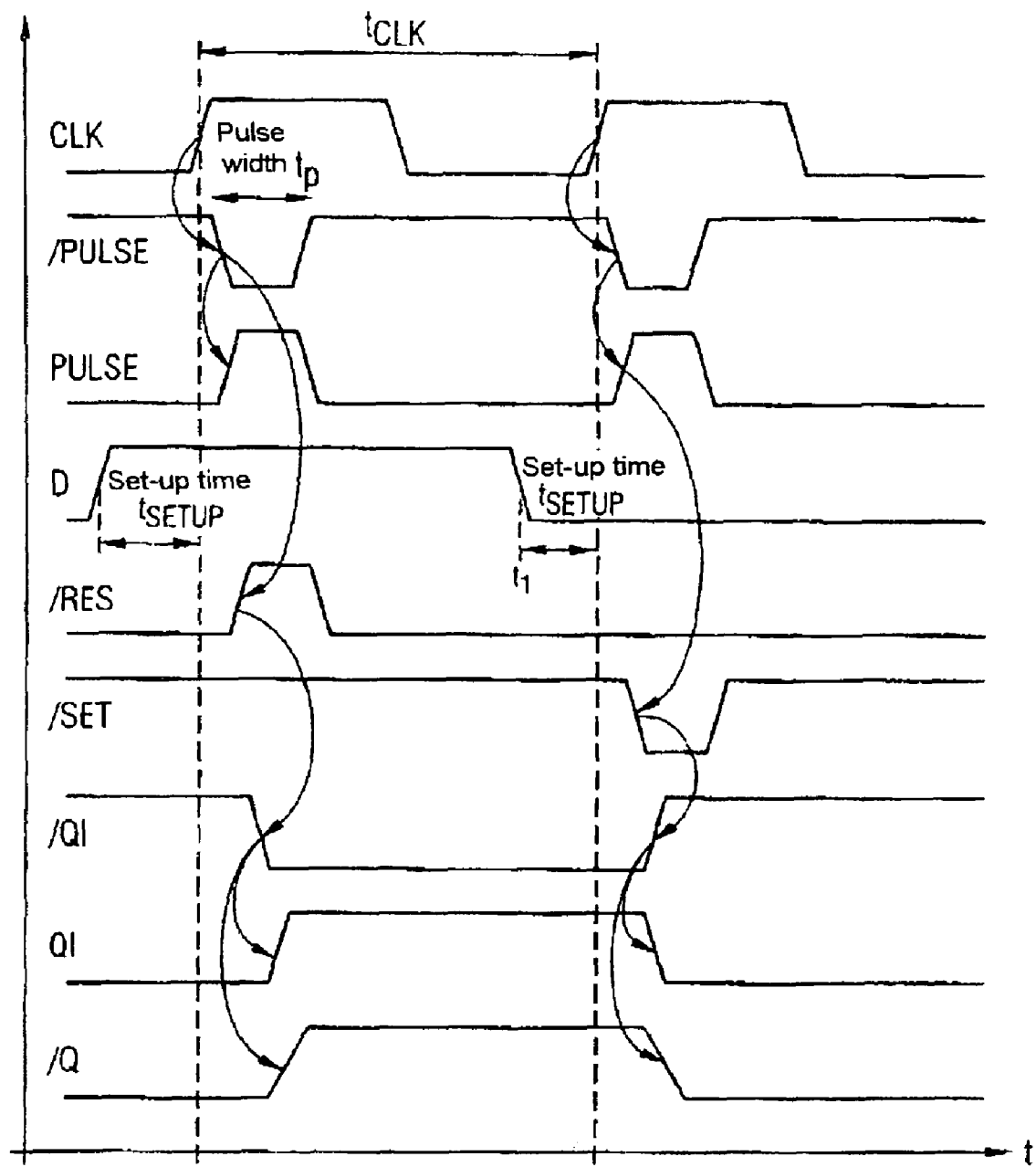
FIGS. 6, 7 are signal waveforms of the flip-flop of FIG. 5.

FIG. 6 illustrates exemplary signal waveforms of the signals which occur in the exemplary inventive flip-flop 100. The uppermost row illustrates a conventional clock signal having a clock period $t_{CLK}$. FIG. 6 also shows, by way of example, pulsed signals PULSE and complementary pulsed signals /PULSE which are generated by the pulse generator 38. A conventional pulse width $t_P$ is, for example, 60 ps. An exemplary data input signal D which is at a logic high level before the first rising clock signal edge and allows the flip-flop 100 a sufficient set-up time $t_{SETUP}$ is also illustrated. In the configuration illustrated here with respect to FIG. 5, the NOR gate 7 generates a reset signal /RES, which essentially corresponds to the pulsed signal PULSE, by combining the internal data signal /D1 with the complementary pulsed signal /PULSE. The NAND gate 6 generates the set signal /SET at a logic high level by combining the internal data signal /D1 or the inverse data signal with the pulsed signal PULSE. The NMOS transistor 64 turns on, and the PMOS push-pull transistor 16 turns off, as a result of the logic high level of the set signal. At the same time, the NMOS push-pull transistor 15, which has a reset signal PULSE at a logic high level applied to its gate connection 24, pulls the potential node 20 to a logic low level or to the second supply potential VSS. A stored logic level /QI is thus present at the line node 20. Consequently, a logic high level is present at the inverter output 22 and the data output signal Q is set to a logic high level by the output driver 42.

At a time $t_1$, the data input signal D changes from the logic high level to the logic low level. In this case, the reset signal /RES remains at a logic low level, as a result of which the NMOS push-pull transistor 15 remains turned off. At the same time, the set signal /SET is set to a logic low level, after the set-up time or a slight time offset caused by the logic signal processing in the NAND gate 6, for the period of a pulse width. As a result, the PMOS push-pull transistor 16 switches the potential node 20 to the first supply potential or logic high level. /QI is thus set to high. Consequently, the signal QI can then be tapped off from the inverter output 22 and the signal Q at a logic low level can be tapped off from the flip-flop output 37 by means of the output driver 42.

Figure 7:
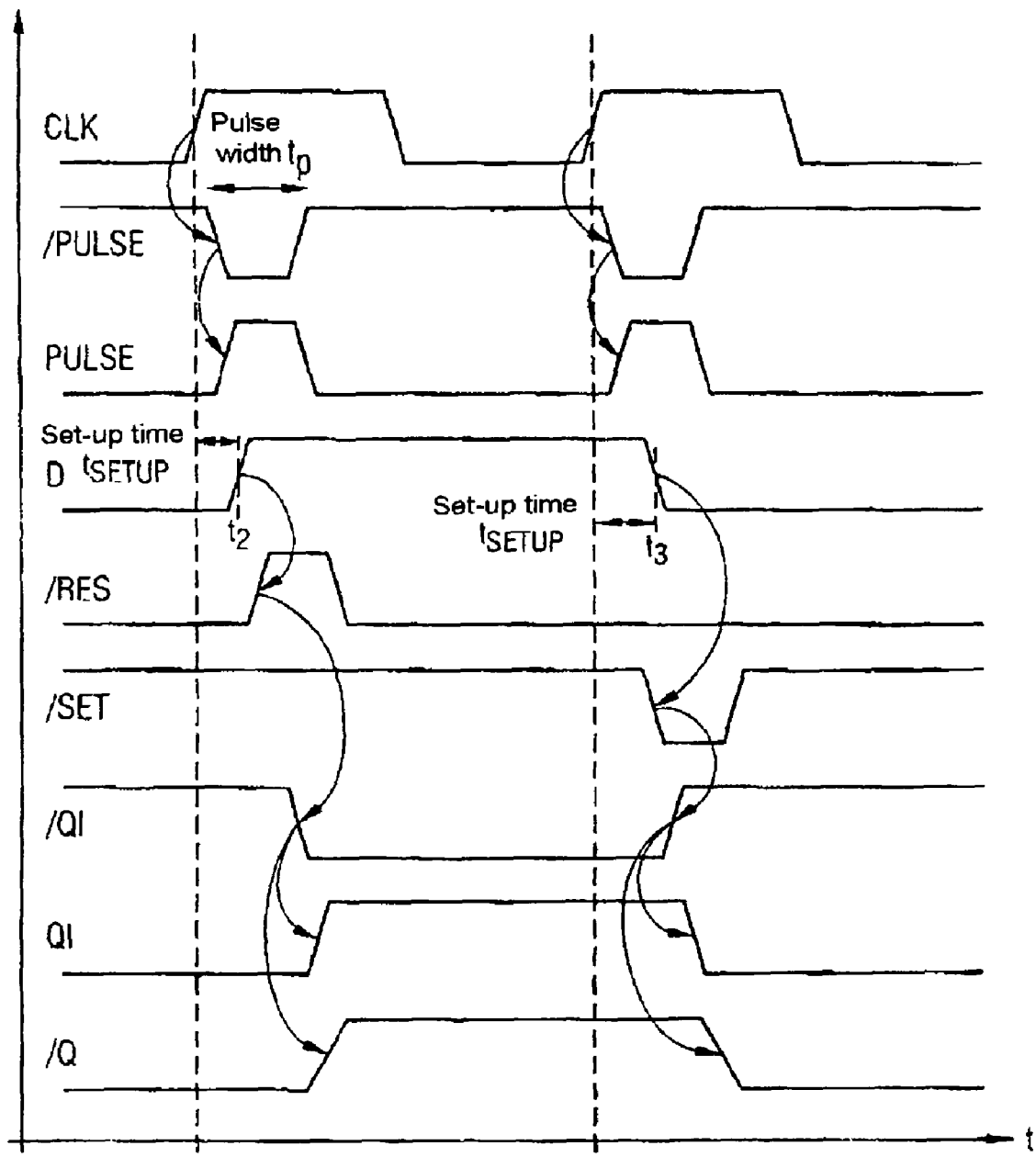

FIG. 7 illustrates exemplary similar signal waveforms for the situation in which there is a negative set-up time. That is to say an input level change is effected after the rising clock edge, that is to say during the respective signal pulse of the pulsed signal PULSE or complementary pulsed signal /PULSE.

The inventive flip-flop 100 nevertheless reliably provides the stored signal level at the flip-flop output 37. At the input signal levels at the times $t_2$, $t_3$, the pulsed signal PULSE is already at a logic high level and the complementary signal /PULSE is at a logic low level for the duration of the pulse width $t_P$. As a result of the fact that, according to this embodiment of the invention, different transistors ensure the logic state of the potential node 20 in the event of signal changes from low to high and high to low, namely the push-pull transistors 16 and 15, the input signal level D can be reliably stored despite the negative set-up time.

Figure 8:
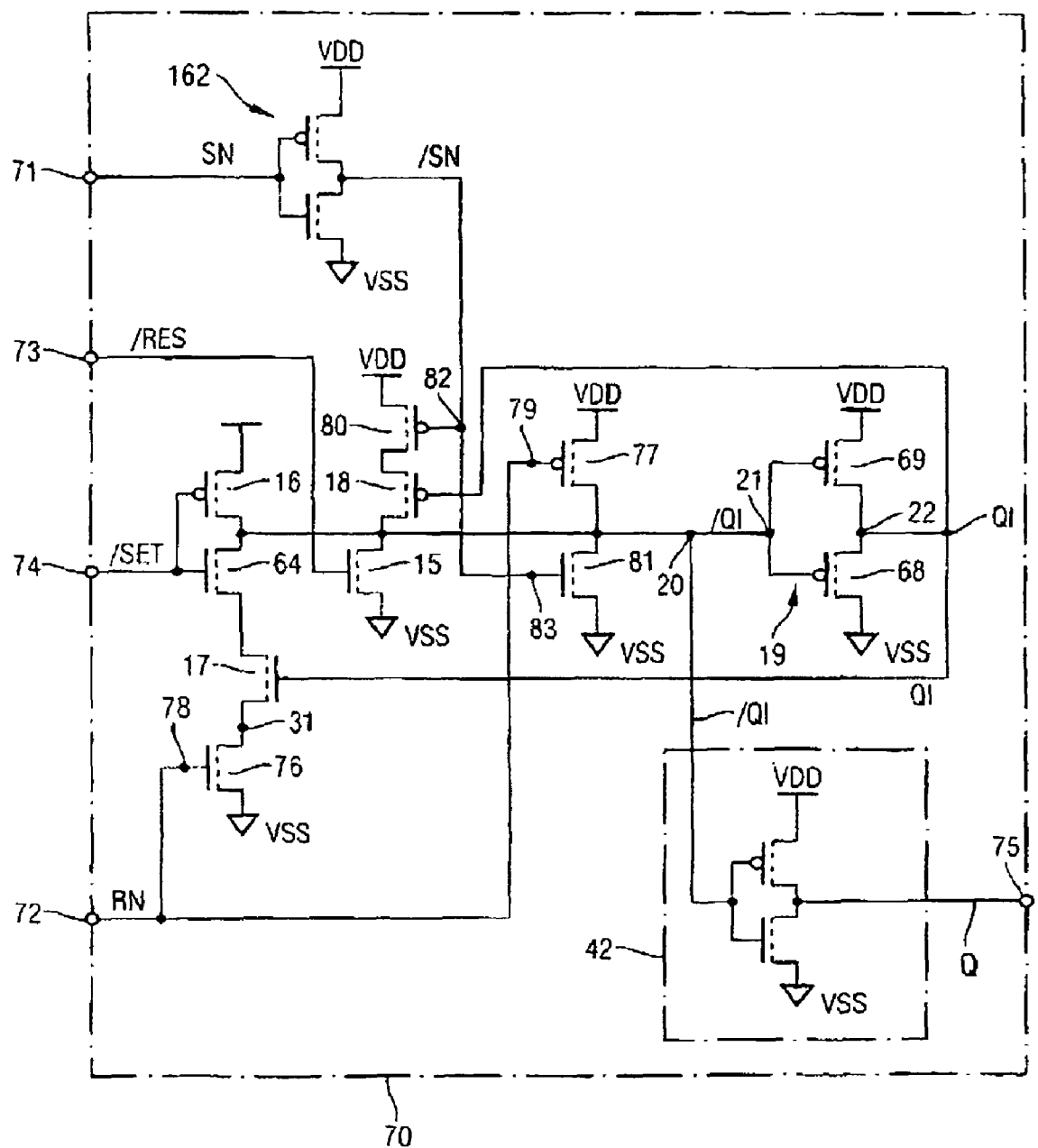
FIG. 8 is an exemplary embodiment of a latch device of a flip-flop having an asynchronous set and reset function.

FIG. 8 illustrates a further embodiment of the latch device for use in the inventive flip-flop. The design 70 of the latch device essentially has the elements of the latch device 45 illustrated in FIG. 5. Further transistors are also provided for the purpose of forming an asynchronous set function and an asynchronous reset function of the flip-flop.

The latch device 70 has an asynchronous set input 71 for an asynchronous set signal SN and an asynchronous reset input 72 for an asynchronous reset signal RN. Inputs 73, 74 for the set and reset signals /SET, /RES are also provided. The logic output signal Q which is driven by the output driver 42 can be tapped off from a latch output 75.

An NMOS reset transistor 76 and a complementary PMOS transistor 77 each having a gate connection 78, 79 and a controllable path are provided. The controllable path of the NMOS reset transistor 76 is connected between the source connection 31 of the NMOS holding transistor 17 and the second supply potential VSS. The controllable path of the PMOS reset transistor 77 is connected between the first supply potential VDD and the potential node 20. The asynchronous reset signal RN is fed to the control connections or gate connections 78, 79 of the reset transistors 76, 77. The NMOS reset transistor turns on its controllable path, and the PMOS reset transistor 77 has a high-impedance load path, as a result of a logic high level of the asynchronous reset signal RN. If the reset signal RN is set to a logic low level, the NMOS reset transistor 76 turns off and the PMOS reset transistor 79 pulls the potential node 20 to a logic high level. The output 75 of the flip-flop or of the latch device is thus at a logic low level when an asynchronous reset signal is at a logic low level.

The asynchronous set signal SN is first of all inverted by an inverter circuit 162 to form the inverse set signal /SN. A PMOS set transistor 80 and an NMOS set transistor 81 each having a controllable path and a gate connection 82, 83 are provided for the asynchronous set function. If the asynchronous set signal is at a logic high level, the PMOS set transistor turns on its controllable path and the NMOS set transistor 81 decouples the second supply potential VSS from the potential node 20. If the asynchronous set signal SN is put to a logic low level, the PMOS set transistor 80 decouples the PMOS holding transistor 18 from the first supply potential VDD and the NMOS set transistor 81 pulls the potential node 20 to the second supply potential VSS, that is to say logic low level. A logic high level is thus always present at the output 75 when a set signal is at a logic low level. Otherwise, the logic states generated by the set and reset signals /SET, /RES and the push-pull transistors 15, 16 are output as an output signal Q on the basis of the input signal D of the flip-flop and the pulsed signals PULSE, /PULSE derived from the edges of the clock signal CLK.

Figure 9:
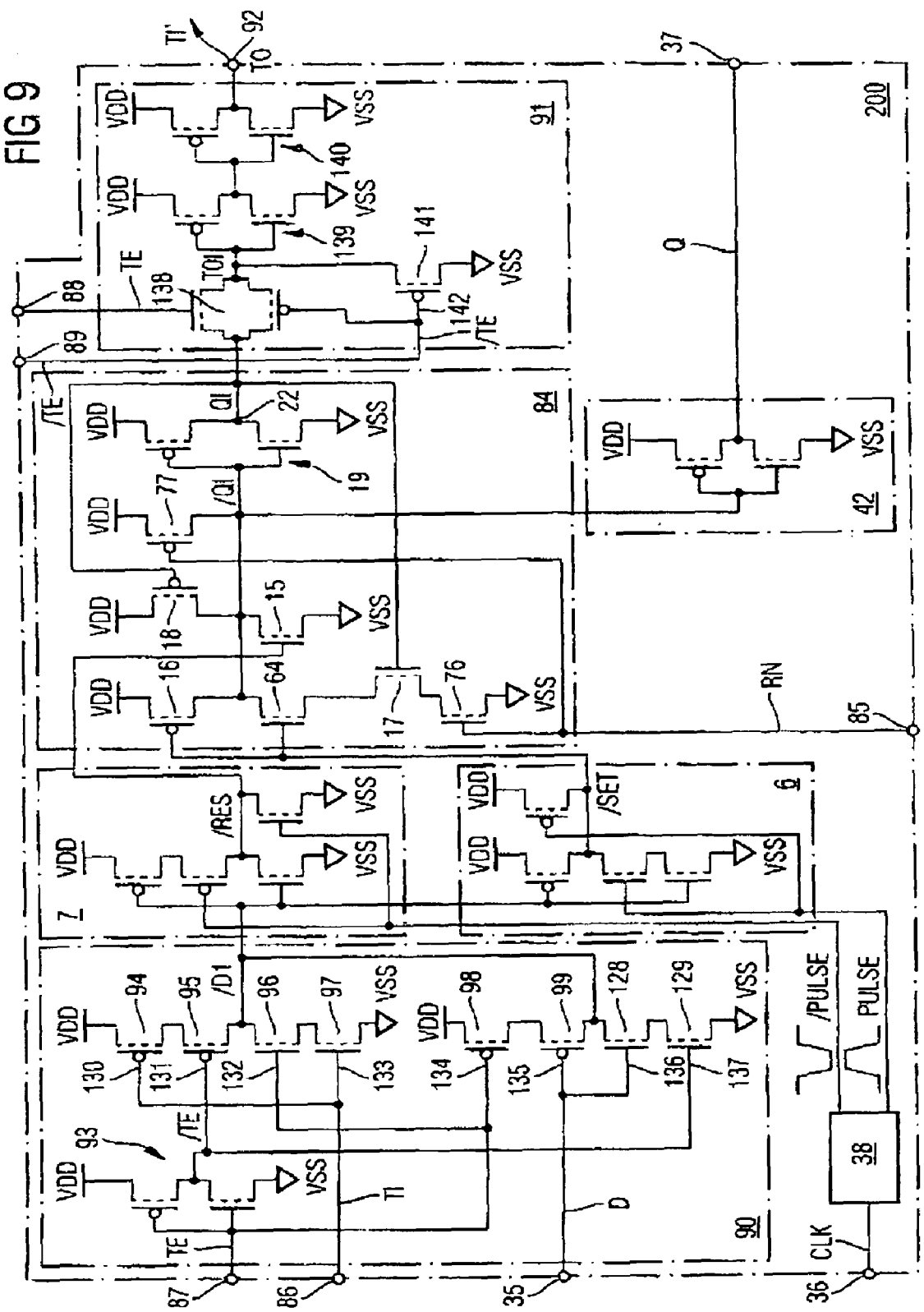
FIG. 9 is a second exemplary embodiment of a flip-flop having a scanning function.

FIG. 9 illustrates another exemplary embodiment of an inventive flip-flop 200. In this case, a pulse generator 38, a NAND gate 6, a NOR gate 7, a latch device 84 and an output driver 42 are provided. In comparison with the latch device 45, the latch device 84 has an extension for asynchronously resetting using the NMOS reset transistor 76 and the PMOS reset transistor 77.

The flip-flop 200 thus also has an asynchronous reset input 85 for an asynchronous reset signal RN. The flip-flop 200 has test signal inputs 86 for a test signal TI and test control inputs 87, 88, 89 for a test control signal TE and a complementary test control signal /TE. A scanning input stage 90 and a scanning output stage 91 are also provided. The flip-flop 200 has a test output 92.

The scanning input stage provides the logic gates 6, 7 with either the inverted data input signal /D1 or the test input signal TI on the basis of the test control signal TE. The test control signal TE is supplied to an inverter 93 which generates an inverted test control signal /TE. The scanning input stage 90 has a plurality of NMOS and PMOS switching transistors 94-99, 128, 129 each having controllable paths and gate connections 130-137 which are connected to one another, as is illustrated in FIG. 9. The scanning input stage 90 is used as a multiplexer in order to couple test signal patterns TI, as internal data signals /D1, to the logic gates 6, 7 in a test mode of the flip-flop 200, which is set by means of a test control signal TE which is at a logic high level. As already explained by way of introduction in FIG. 3, a plurality of (inventive) flip-flops 200 are connected together to form a shift register in the test mode or scanning mode.

For the exemplary embodiment, the flip-flop 200 also has a scanning output stage 91 which is coupled to the output 22 of the inverter 19 in the latch device 84 and switches through the internal logic level QI, as a test output signal TO, to the test output 92 or switches the test output 92 to a predefined logic level on the basis of the test control signal TE, /TE. To this end, provision is made of a transmission gate 138 which is controlled by the test control signal and the inverse test control signal TE, /TE. If the test control signal TE is at a logic high level (and the complementary test control signal /TE is thus at a logic low level), the transmission gate 138 switches through the level applied to the output 22 of the inverter 19, as a level TOI, to the inverter 139 and the inverter 140, with the result that the level QI is provided as a test output signal at the test output 92. If the test control signal TE is at a logic low level, the transmission gate 138 decouples the inverter output 22 from the inverters 139, 140 of the scanning output stage 91, and an NMOS switching transistor 141 having a controllable path and a gate connection 142, to which the inverse or complementary test control signal /TE is fed, pulls the logic level of the signal TOI to the second supply potential VSS, that is to say logic low level. The test output 92 is thus at a logic low level in the normal operating mode, that is to say when a test control signal TE is at a low level and an inverse test control signal /TE is at a high level. When connected in the form of a shift register chain, as is illustrated in FIG. 3, the test output signal TO is always supplied to a further flip-flop device as a test input signal TI. As a result of the fixed potential level, logic low level, no further power loss caused by reversing the charge of the input capacitances is thus produced in a corresponding scanning input stage 90.

Figure 10:
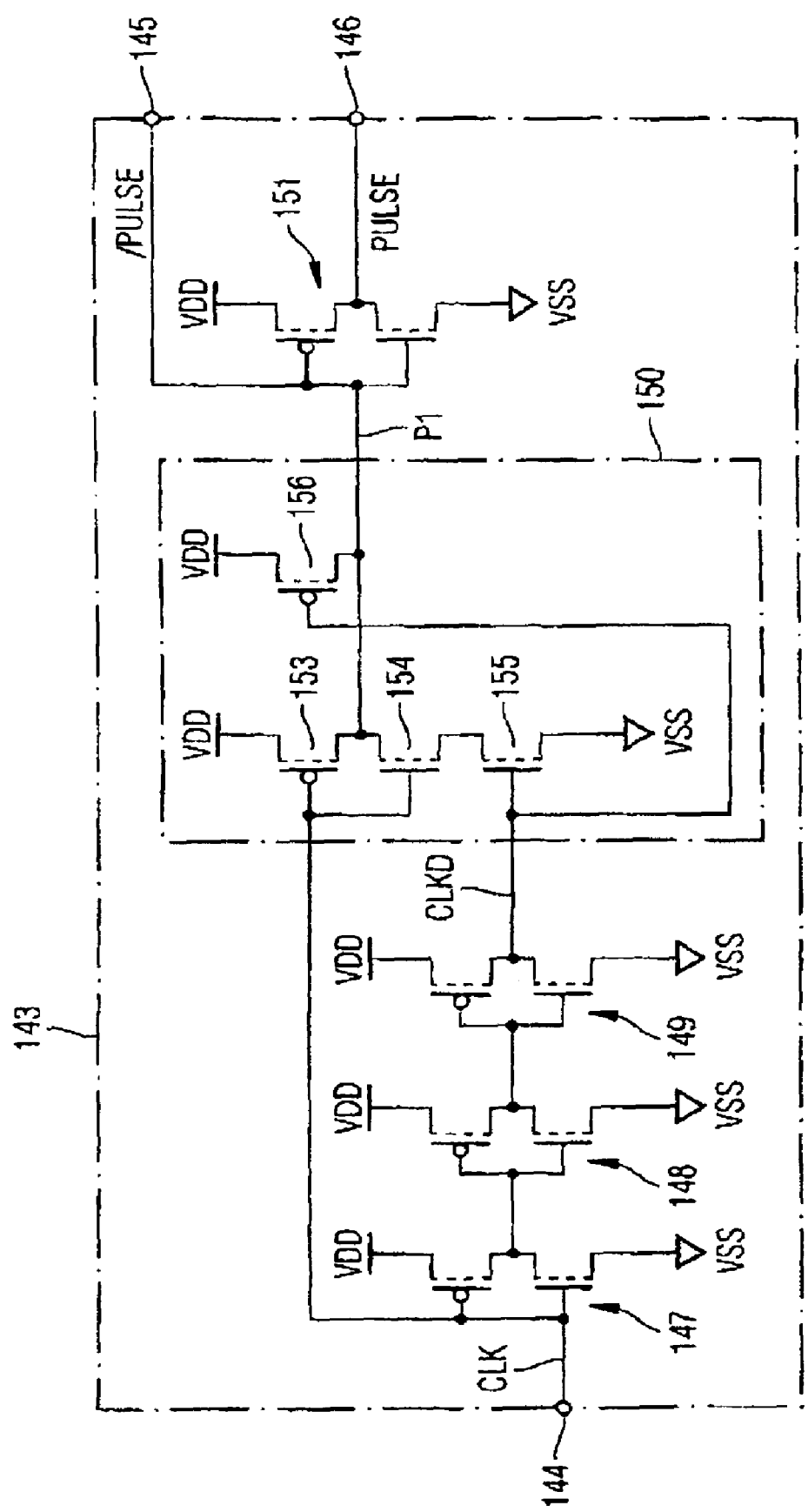
FIGS. 10, 11, 12 are exemplary embodiments of a pulse generator for the flip-flop.

FIG. 10 illustrates another exemplary embodiment of a pulse generator for the inventive flip-flop. The pulse generator 143 has a clock input 144 and outputs 145, 146 for the pulsed signal PULSE and the complementary pulsed signal /PULSE. In the example illustrated here, provision is made of a delay path which is constructed from three inverters 147, 148, 149, is supplied with the clock signal CLK and outputs a delayed clock signal CLKD.

The clock signal CLK and the delayed clock signal CLKD are supplied to a NAND gate 150 having two NMOS transistors 154, 155 and two PMOS transistors 153, 156 which are connected, as is illustrated in FIG. 10. The corresponding output signal P1 from the NAND gate corresponds to the complementary pulsed signal /PULSE and is fed to the output 145. An inverter 151 inverts the complementary pulsed signal /PULSE to form the pulsed signal PULSE which is fed to the output 146.

The NMOS transistors 154, 155 ensure rapid switching, or rapid generation of a transition from a high level to a low level, at the input of the inverter 151 upon a rising clock edge.

The PMOS transistor of the inverter 151 likewise ensures a rapid transition from a low level to a high level upon a rising clock edge of the clock signal CLK.

Figure 11:
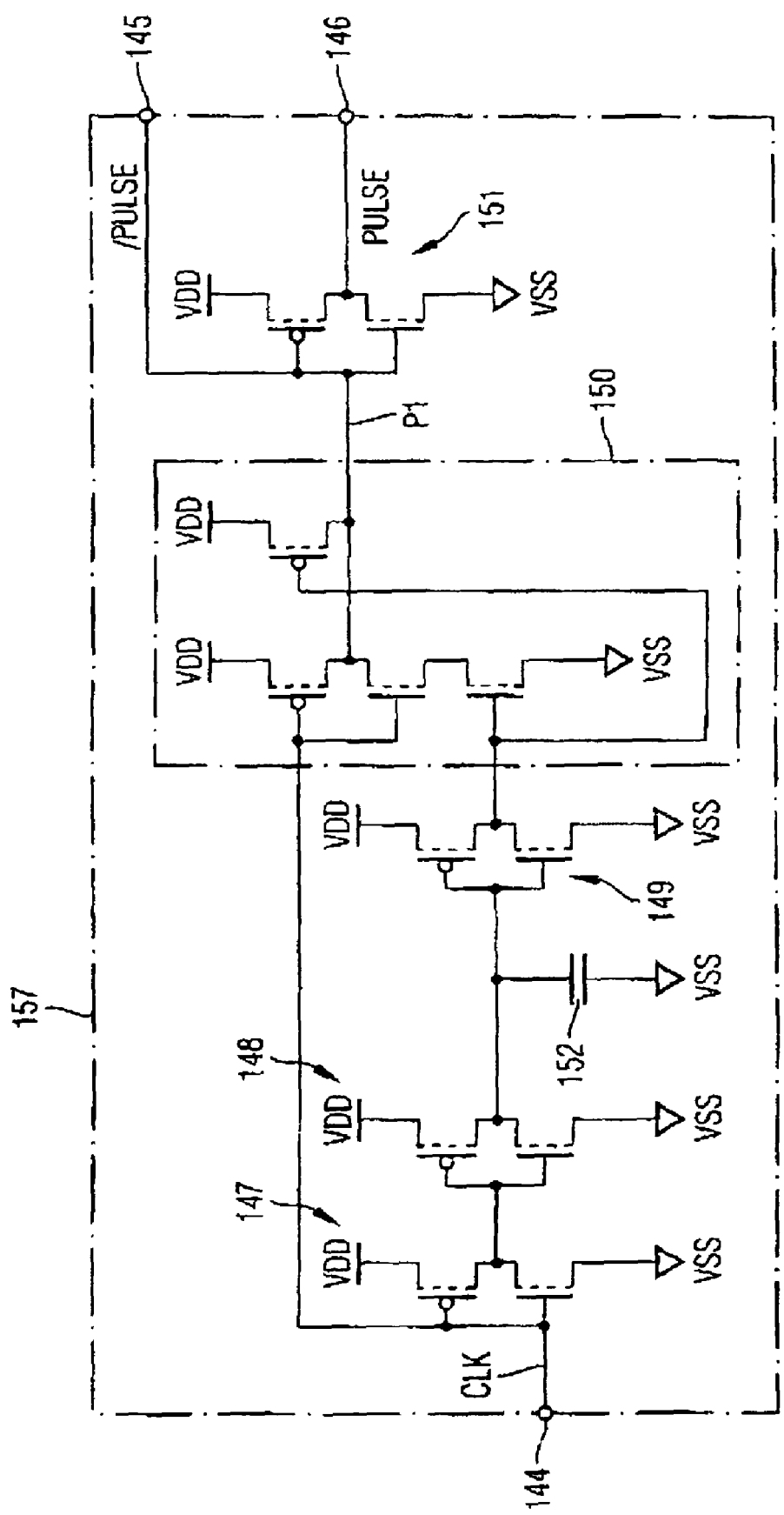

FIG. 11 illustrates one possible embodiment of the pulse generator. The developed pulse generator 100, 157 essentially has the same elements as the pulse generator 143 but a charging capacitor 152 which increases the delay time of the clock signal CLK, said delay time being caused by the delay path, is provided between the second and third inverters 148, 149 of the delay path. As a result, the pulse width of the pulses of the pulsed signal PULSE and of the complementary pulsed signal /PULSE is increased. The transparency phase of the inventive flip-flop is thus lengthened in comparison with the pulses generated by the pulse generator 143. This may occur when the set-up time is violated by particularly slow logic circuits as are denoted using the reference symbols 109-117 in FIG. 3.

Figure 12:
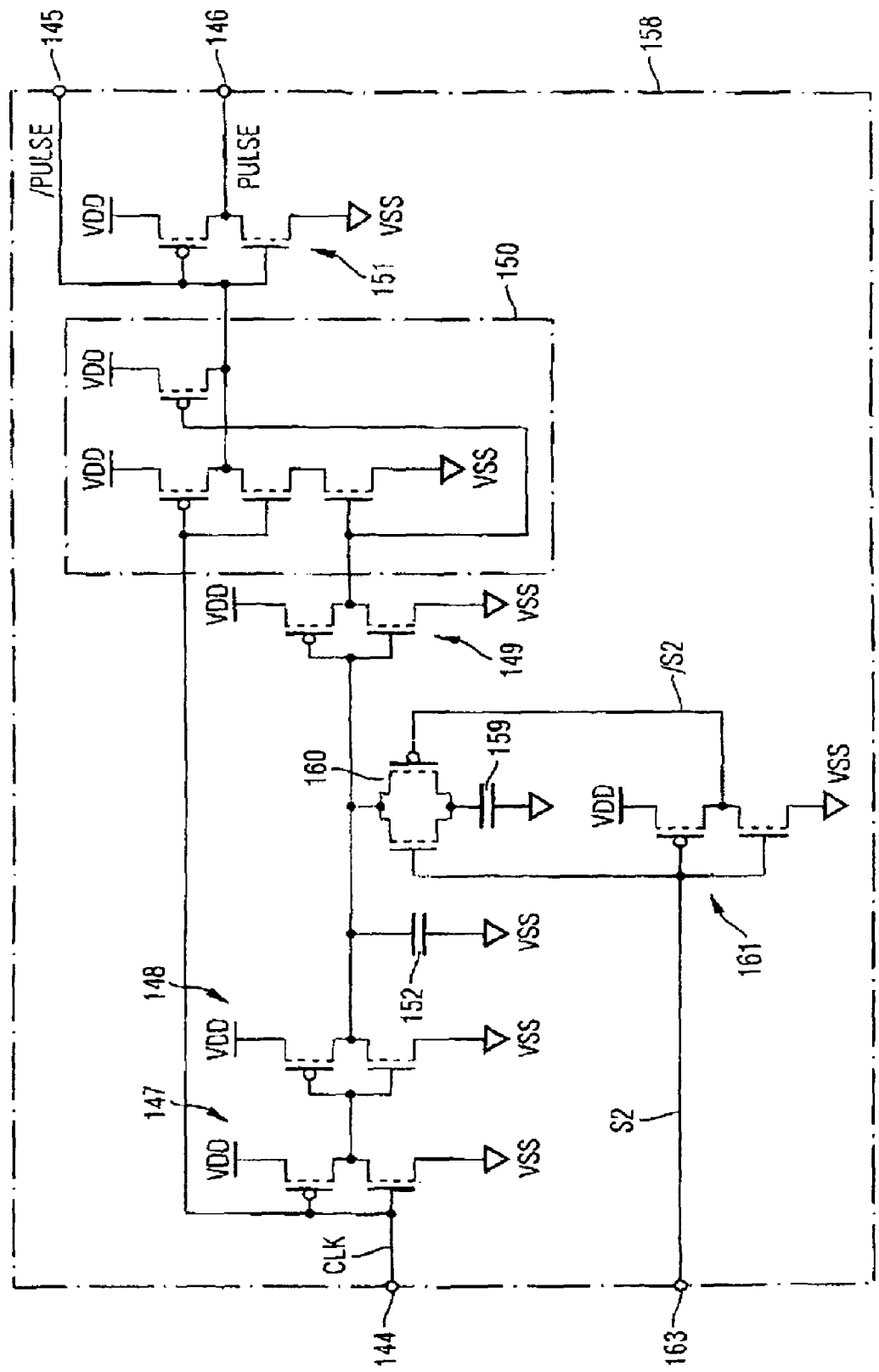

FIG. 12 shows a pulse generator 158 which, in comparison with the pulse generator 157 from FIG. 11, has a capacitance 159 which can be connected in a programmable manner. To this end, provision is made of a transmission gate 160 which decouples the additional capacitor 159 from, and connects it to, the input of the third inverter 149 of the delay path. The transmission gate 160 can be controlled using a programming signal S2 which is supplied to a programming input 163. An inverter 161 for generating an inverse programming signal /S2 is also provided.

The programmable design of the additional capacitance 159, and thus the ability to program the delay time, makes it possible to set the transparency phase during operation of the flip-flop by extending the pulse widths. This is particularly advantageous if, after the flip-flop and further circuits have been formed on a semiconductor chip, process fluctuations which cause offsets in the clock signals, for example, are determined. The pulse generator can, in particular, also be assigned to a plurality of flip-flops which are, for example, formed on the semiconductor substrate such that they are adjacent and receive a common clock signal.

Figure 13:
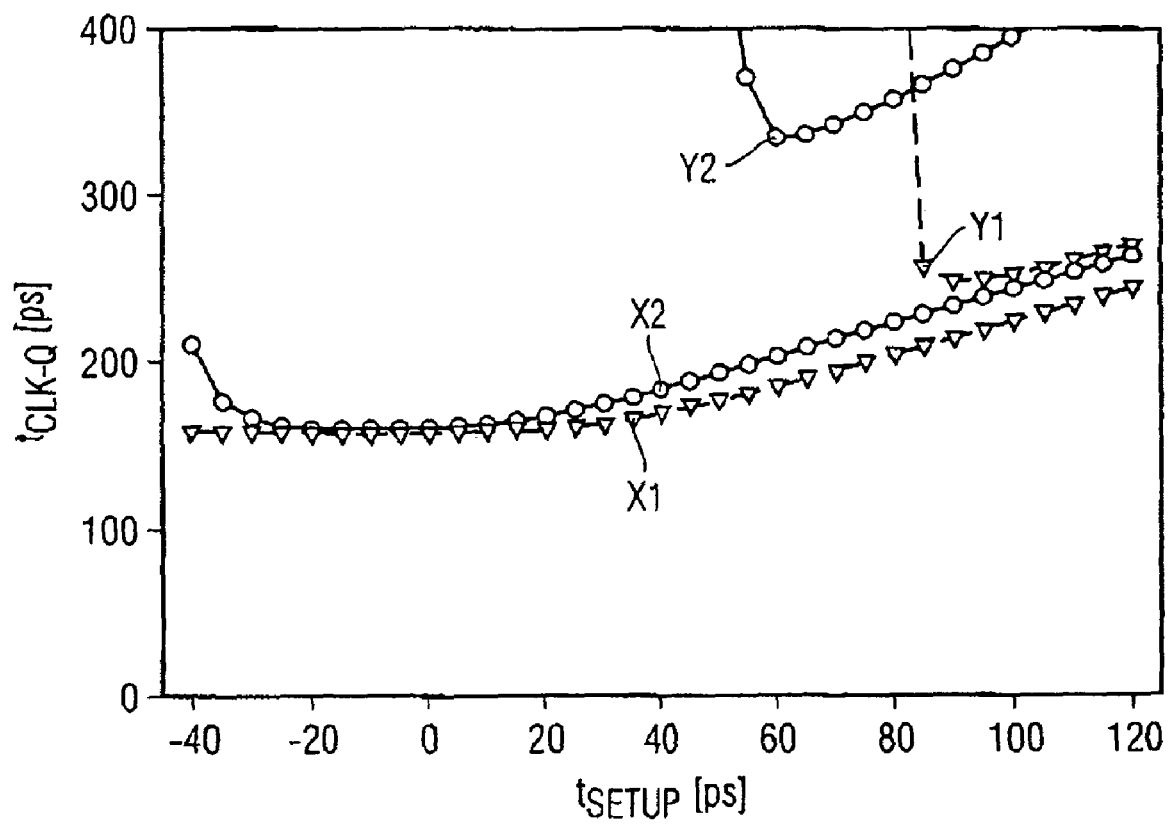
FIG. 13 are delay times of the inventive flip-flop in comparison with delay times of conventional flip-flops.

FIG. 13 illustrates the delay time $t_{CLK-Q}$ on the basis of a set-up time $t_{SETUP}$ for an exemplary embodiment of an inventive flip-flop in comparison with conventional master/slave flip-flops.

In this case, the curves X1 and X2 correspond to simulation results for an inventive flip-flop 200 according to FIG. 9 for typical supply voltages for CMOS technologies, and a capacitive load at the output of the flip-flop of 60 fF (as is illustrated in FIG. 3 using the capacitor 118-126) was assumed.

The curves Y1 and Y2 correspond to simulations for a master/slave flip-flop according to FIG. 1. In this case, the curves X1 and Y1 represent the delay times in the event of an input signal level change from a logic high to a logic low. The curves X2 and Y2 correspond to a level change in the input signal from a logic low level to a logic high level. FIG. 13 reveals, on the one hand, that the inventive flip-flop has an essentially constant delay time $t_{CLK-Q}$ over a wide range of set-up times $t_{SETUP}$, for example between −40 and +60 ps.

The delay times are also essentially the same for input signal level changes from 0 to 1 and from 1 to 0 or from low to high and high to low. In contrast, the delay times in the event of the different input level changes differ considerably from one another in conventional master/slave arrangements.

In addition, the delay time $t_{CLK-Q}$ is considerably longer in the case of master/slave flip-flops. The different delay times in the event of a level change from 0 to 1 and from 1 to 0 in master/slave arrangements are essentially due to the fact that the same controllable switches or the same transistors drive the signal changes within the flip-flop. In this case, fluctuations between PMOS and NMOS designs of such transistors cannot be avoided.

In contrast, in the inventive flip-flop, the PMOS or NMOS design of the respective push-pull transistors can be matched in a specific manner in order to achieve rapid switching times or push-pull times. FIG. 13 clearly shows that the inventive flip-flop is considerably more robust to the set-up time. In this case, negative set-up times denote signal changes or signal edges which temporally take place after the rising clock signal edge.

The present invention thus provides a rapid pulsed static flip-flop which is particularly robust to process fluctuations and clock offsets. The inventive flip-flop is particularly suitable for implementation using low-consumption CMOS technologies, in particular CMOS technologies. The inventive flip-flop can be easily adapted to capacitive loads to be driven and is preferably suitable for implementation in a standard cell library.

Although the present invention was explained with reference to preferred exemplary embodiments, it is not restricted to the latter but rather can be multifariously modified. In particular, the size and driver or switching properties of the PMOS and NMOS transistors used can be adapted to the respective conditions of use of the flip-flop. The pulse generator used may control a plurality of flip-flops or may be locally reserved for each individual flip-flop. In addition to the inputs and outputs which are denoted connections, further signals which can be externally tapped off can be routed out of the flip-flop if they are required for particular applications.

What is claimed is:

1. A pulsed static flip-flop comprising:
  a first logic device which combines a logic signal with a pulsed signal and outputs a set signal;
  a second logic device which logically combines said logic signal with a complementary pulsed signal and outputs a reset signal, and
  a latch device comprising storage which holds a logic hold level to be tapped off as a stored logic state of said logic signal; said logic hold level being adjustable to a first logic level by a first push-pull transistor controlled by said set signal and to a second logic level by a second push-pull transistor controlled by said reset signal;
  wherein said second push-pull transistor is a push-pull transistor that is complementary to said first push-pull transistor; and
  wherein said second logic device is in the form of a NOR gate.

2. The flip-flop of claim 1, wherein said latch device comprises an inverter which comprises an input, an output, a holding transistor, and a complementary holding transistor; each of said holding and complementary holding transistors including a controllable path and a control connection, said input being connected to a potential node between said controllable paths of said holding and complementary holding transistors, said holding and complementary holding transistors being connected in series between a first supply potential connection and a second supply potential connection, said output being connected to said control connections of said holding and complementary holding transistors, said input being switchable, via said push-pull transistor, on the basis of said reset signal at said second supply potential connection and being switchable, via said complementary push-pull transistor, on the basis of said set signal at said first supply potential connection, and said stored logic state of said logic signal being able to be tapped off from said input.

3. The flip-flop of claim 2, wherein each of said push-pull and complementary push-pull transistors comprises a controllable path and a control connection; said controllable paths of said push-pull and complementary push-pull transistors being connected in series between said first supply potential connection and said second supply potential connection, said reset signal being fed to said control connection of said complementary push-pull transistor, said set signal being fed to said control connection of said push-pull transistor, and said input of said inverter being connected to a further potential node between said controllable paths of said push-pull and complementary push-pull transistors.

4. The flip-flop of claim 2, further comprising a further transistor which comprises a controllable path and a control connection; said controllable path of said further transistor being connected between said potential node and said controllable path of said holding and complementary holding transistors, and said set signal being fed to said control connection of said further transistor.

5. The flip-flop of claim 2, further comprising a further complementary transistor which comprises a controllable path and a control connection; said controllable path of said further complementary transistor being connected between said controllable path of said complementary holding transistor and said potential node, and said reset signal being fed to said control connection of said further complementary transistor.

6. The flip-flop of claim 1, wherein said first logic device comprises a NAND gate.

7. The flip-flop of claim 6, wherein said first logic device comprises a first logic transistor, a second logic transistor, a first complementary logic transistor, and a second complementary logic transistor each comprising a controllable path and a control connection;

said controllable path of said first complementary logic transistor and said controllable paths of said first and second logic transistors being connected in series between a first supply potential connection and a second supply potential connection, and said controllable path of said second complementary logic transistor being connected between said first supply potential connection and a set signal node which is present between said controllable path of said first complementary logic transistor and said controllable path of said first logic transistor;

said pulsed signal being fed to said control connections of said first and said second complementary logic transistors;

said logic signal being fed to said control connections of said first complementary logic and said second logic transistors; and said set signal being able to be tapped off from said set signal node.

8. The flip-flop of claim 1, wherein said second logic device comprises a first logic transistor, a second logic transistor, a first complementary logic transistor, and a second complementary logic transistor each comprising a controllable path and a control connection, said controllable paths of said first and second complementary logic transistors and said controllable path of said first logic transistor being connected in series between a first supply potential connection and a second supply potential connection, and said controllable path of said second logic transistor being connected between a reset signal node and said second supply potential connection, said reset signal node being present between said controllable path of said second complementary logic transistor and said controllable path of said first logic transistor;

said logic signal being fed to said control connections of said first complementary logic and said first logic transistors;

said complementary pulsed signal being fed to said control connections of said second complementary logic and said second logic transistors; and said reset signal being able to be tapped off from said reset signal node.

9. The flip-flop of claim 1, wherein the flip-flop is further configured to have an asynchronous reset function.

10. The flip-flop of claim 2, wherein the flip-flop is further configured to have an asynchronous reset function and further comprising a reset transistor and a complementary reset transistor each comprising a controllable path and a control connection; said controllable path of said reset transistor being connected between said controllable path of said holding transistor and said second supply potential connection, said controllable path of said complementary reset transistor being connected between said first supply potential connection and said input of said inverter, and an asynchronous reset signal being fed to said control connections of said reset and complementary reset transistors.

11. The flip-flop of claim 1, wherein the flip-flop is further configured to have an asynchronous set function.

12. The flip-flop of claim 2, being designed to have an asynchronous set function and further comprising a set transistor and a complementary set transistor each comprising a controllable path and a control connection; said controllable path of said set transistor being connected between said input of said inverter and said second supply potential connection, said controllable path of said complementary set transistor being connected between said first supply potential connection and said controllable path of said complementary holding transistor, and an asynchronous set signal being fed to said control connections of said set transistors.

13. The flip-flop of claim 1, wherein said push-pull transistor is in the form of an NMOS transistor and said complementary push-pull transistor is in the form of a PMOS transistor or wherein said pull transistor is in the form of an NMOS transistor, said complementary push-pull transistor is in the form of a PMOS transistor, and said push-pull and complementary push-pull transistors are designed utilizing CMOS technology.

14. A circuit arrangement comprising
a plurality of pulsed static flip-flop devices connected in series and each comprising a data input and a data output; and
a logic circuit being coupled between a data output of a first flip-flop device of said flip-flop devices and a data input of a second flip-flop device of said flip-flop devices; at least one of said flip-flop devices comprising:
a first logic device logically combining a logic signal, applied to its data input, with a pulsed signal and outputting a set signal;
a second logic device logically combining said logic signal with a complementary pulsed signal and outputting a reset signal, and
a latch device comprising storage which holds a logic hold level being fed to said data output of the relevant flip-flop as a stored logic state of said logic signal; said logical hold level being adjustable to a first logic level by a first push-pull transistor controlled by said set signal to a second logic level by a second push-pull transistor controlled by said reset signal;
wherein said second push-pull transistor is a push-pull transistor that is complementary to said first push-pull transistor; and wherein said second logic device is in the form of a NOR gate.

15. The circuit arrangement of claim 14, wherein at least one of said flip-flop devices comprises a pulse generator which generates said pulsed and complementary pulsed signals on the basis of a clock signal.

16. The circuit arrangement of claim 14, further comprising a pulse generator which generates pulsed signals and complementary pulsed signals for a plurality of said flip-flop devices on the basis of a clock signal.

* * * * *